United States Patent [19]
Kinnaird

[11] Patent Number: 5,839,640
[45] Date of Patent: Nov. 24, 1998

[54] MULTIPLE-TOOL WIRE BONDER

[75] Inventor: Clark D. Kinnaird, Richardson, Tex.

[73] Assignee: Texas Instruments Incorporated, Dallas, Tex.

[21] Appl. No.: 735,617

[22] Filed: Oct. 23, 1996

[51] Int. Cl.⁶ .................................................. H01L 21/60
[52] U.S. Cl. ................................. 228/4.5; 228/9; 29/428
[58] Field of Search ............................... 228/4.5, 180.5, 228/9; 29/428

[56] References Cited

U.S. PATENT DOCUMENTS

| | | | |
|---|---|---|---|
| 4,142,288 | 3/1979 | Flammer et al. | 228/4.5 |
| 5,474,224 | 12/1995 | Nishimaki et al. | 228/9 |
| 5,516,023 | 5/1996 | Kono | 228/9 |

FOREIGN PATENT DOCUMENTS

| | | | |
|---|---|---|---|
| 61-78133 | 4/1986 | Japan | 228/4.5 |
| 5-102223 | 4/1993 | Japan | 228/180.5 |

*Primary Examiner*—Patrick Ryan
*Assistant Examiner*—Jeffrey T. Knapp
*Attorney, Agent, or Firm*—W. James Brady, III; Richard L. Donaldson

[57] ABSTRACT

A multiple-tool ball bonder includes a first tool (50, 150) and a second tool (52, 152) mounted on a single head (82, 182) requiring only one vision system (78, 178), one positioning system (68, 168), and one computer system (56, 228). The ball bonder (44, 144) allows for the single head (82, 182) to create interconnections between semiconductor devices (10, 148) and lead frame fingers (12, 148) in a first direction with the first tool (50, 150) and the second tool (52, 152) allows interconnections in a second direction (40) without requiring additional equipment or processing runs.

18 Claims, 3 Drawing Sheets

MULTIPLE-TOOL WIRE BONDER

TECHNICAL FIELD OF THE INVENTION

The present invention relates to interconnections on semiconductor devices, and more particularly to a multiple-tool wire bonder.

BACKGROUND OF THE INVENTION

Ball bonding is a widely used technique in semiconductor fabrication to connect internal semiconductor die to external leads. Oriented fine-pitch capillaries are used to bond wire or dies with pad pitches below 90 µm. These capillaries bond over a limited angle. In order to orient the bonds about a first (e.g., vertical) direction and a second (e.g., horizontal) direction, the semiconductor chips have to be run through two different machines or twice through the same machine with different capillary orientation. Another alternative is to use a two-headed wire bonder such as the ABACUS III, which is available from Texas Instruments Incorporated, Dallas, Tex. These options require additional work and involve increased likelihood of error with the additional work.

SUMMARY OF THE INVENTION

Therefore, a need has arisen for a ball bonder that can efficiently administer fine pitch, oriented capillaries in two directions without the need for an additional machine or a second run through the machine. According to an aspect of the present invention, a wire bonder is provided that eliminates or substantially reduces the shortcomings associated with previously developed ball bonders and techniques for bonding. In accordance with an aspect of the present invention, a ball bonder is provided having a computer, a vision system, a positioning system, and a bonding head with a first tool for bonding in a first direction and a second bonding tool for bonding in the second direction. According to another aspect of the present invention, a Z driver is coupled to a wire bonding head having at least a first and a second tool for selectively bringing the first tool or the second tool into contact with a semiconductor chip.

A technical advantage of the present invention is it allows interconnections between semiconductor devices and lead frame fingers in a first direction and a second direction without requiring additional equipment. Another technical advantage of the present invention is that it allows for the creation of interconnections between semiconductor devices and lead frame fingers in the first direction and a second direction without requiring additional processing runs.

BRIEF DESCRIPTION OF THE DRAWINGS

For a more complete understanding of the present invention, and the advantages thereof, reference is now made to the following written description taken in conjunction with the accompanying drawings, in which.

DETAILED DESCRIPTION OF THE INVENTION

The preferred embodiments of the present invention and its advantages are best understood by referring to FIGS. 1 through 7 of the drawings, like numerals being used for like and corresponding parts of the various drawings.

Figure 1:
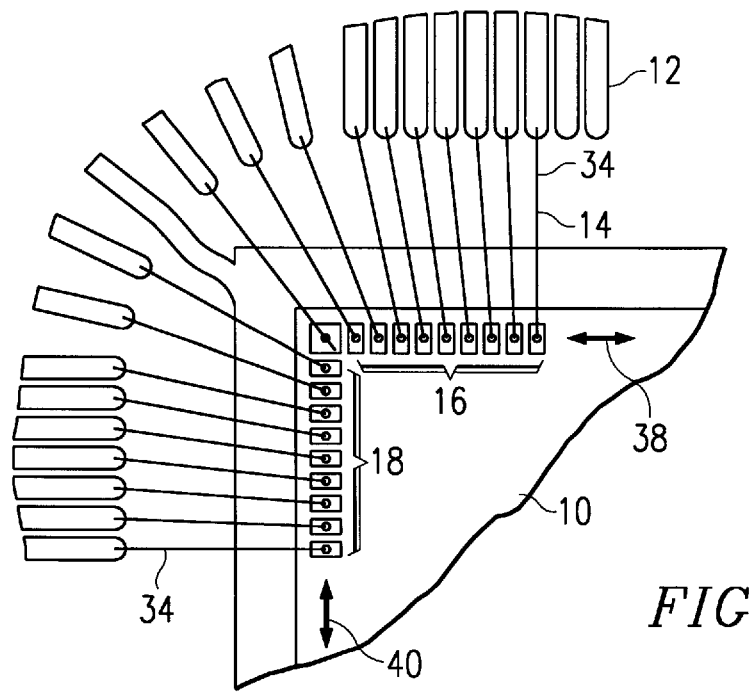
FIG. 1 is a schematic diagram of a portion of a semiconductor chip mounted on a lead frame.
Figure 2:
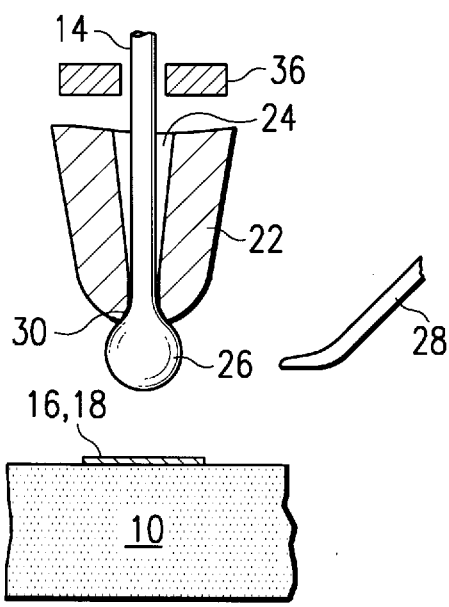
FIG. 2 is a cross-sectional schematic diagram of a portion of a ball bonder.
Figure 3:
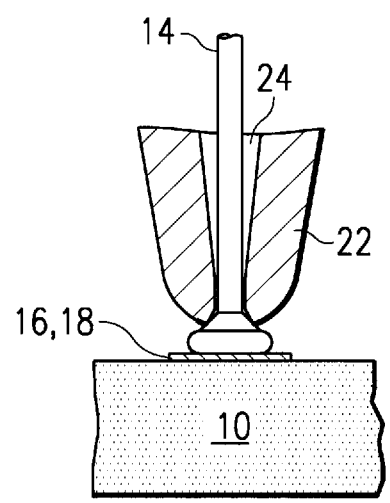
FIG. 3 is a cross-sectional schematic diagram of the ball bonder of FIG. 2 showing the formation of a ball bond.

Referring to FIGS. 1–3, an internal semiconductor die or chip 10 is connected to external leads or fingers 12 of a lead frame. Ball bonding is widely used to make such connections. The connecting process typically involves attaching fine wires 14, which are frequently gold or aluminum wires 25–30 µm in diameter, to lead fingers 12 and bonding pads 16 and 18 as shown in FIG. 1.

The present invention particularly facilitates fine pitch capillary ball bonding, which extends the ball bonding technique into bonding with pad pitches typically below 90 µm. Basic ball bonding involves forming a ball at one end of wire 14 for bonding to a first bonding pad, for example bonding pad 16, by a compression arm (e.g., 200 of FIG. 5). The compression arm has a capillary tube 22 with a wire 14 slidably disposed within capillary 24 of capillary tube 22. A ball, or free air ball, 26, is formed on the end of wire 14 by typically using an electronic flame off ("EFO") 28 (FIG. 2). Ball 26 is centered within the inside chamfer 30 of capillary tube 22. Ball 26 is then lowered onto bonding pad 16, 18 and compressed against die 16, 18 as shown in FIG. 3. The attachment of wire 14 using ball 26 to die pad or bonding area 16 and 18 occurs through a combination of plastic deformation and interfacial slip of the two materials due to the load, temperature and ultrasonic energy applied. The compression arm and capillary tube 22 form the weldment or bond through the direct pressure, but also by additional energy being applied ultrasonically or thermally or by other means.

After the first bond on bonding pad 16, 18 is formed, the compression arm moves the capillary tube 22 to the bonding pad of lead frame or finger 12 while wire 14 is fed out through the capillary tube 22 to form a wire loop 34 (FIG. 1). Pressure and energy are again applied to the bonding area 12 through a capillary tube 22 to form a bond between wire 14 and bonding pad 12 of the lead frame fingers. Capillary tube 22 is then pulled away from the bonding pad 12 by the compression arm. While capillary tube 22 is moved away from the bonding pad 12, the wire 14 extending through the capillary tube 22 is latched or clamped by clamp 36 (FIG. 2) and this causes a portion of wire 14 extending from the bonding pad 12 through capillary tube 22 to detach from the bonding pad 12. This leaves only the wire loop 34 extending from the bonding pad 16, 18 of the integrated circuit or chip 10 to the bonding pad 12 of the lead frame finger. Another ball 26 is then formed at the end of wire 14 from the capillary tube 22 and the process is repeated. Reference is made to U.S. Pat. No. 3,641,660, entitled "The Method of Ball Bonding With An Automatic Semiconductor Bonding Machine," assigned to Texas Instruments Incorporated, which is incorporated herein for all purposes.

In order to accommodate increased density of bond pads on semiconductor chips 10, the connections must be closer and closer. To accomplish this, fine-pitch capillaries are used which have a specific orientation. For example, with reference to FIG. 1, the wire loops 34 connected to bond pads 16 have a first orientation (e.g., vertical) as they are applied in a first direction 38, and similarly, the bond pads 18 have a second orientation (e.g, horizontal) as applied in a second direction 40. These connections are accommodated by having a substantially rectangular or other capillary tube shape that allows closer bonding in one direction. To place loops 34 on chip 10 in a first direction 38 and a second direction 40 has required running the chip through the machine twice with the capillary tube being reoriented between runs or being run through two separate machines or through a machine with twice the equipment, i.e., two full heads.

Figure 4:
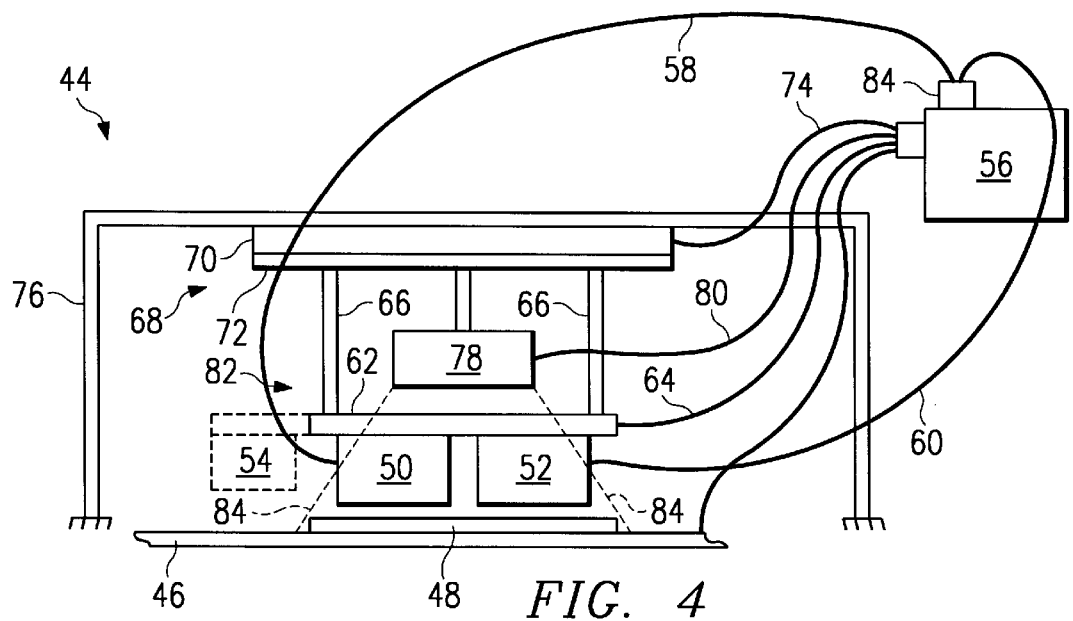
FIG. 4 is a schematic diagram of one embodiment of the present invention.

Referring now to FIG. 4, a ball bonder 44 according to one embodiment of the present invention is shown in a schematic form. Ball bonder 44 may include or work with a material handling system 46 for delivering semiconductor chips on lead frames 48 to a position to be worked upon by a first bonding tool 50 and a second bonding tool 52. Bonding tools 50 and 52 of single-head ball bonder 44 each include a compression arm, EFO, and clamp or latch for administering bonds on chip and lead frame 48.

First bonding tool 50 may administer bonds having a first orientation, e.g., direction 38 in FIG. 1, and second bonding tool 52 may administer bonds in a second direction, e.g., direction 40 in FIG. 1. Additional bonding tools could be added such as third bonding tool 54 shown in broken lines on FIG. 4. Third bonding tool 54 could create bonds with yet a third orientation or configuration.

Bonding tools 50 and 52 are coupled to computer 56 by cables 58 and 60, respectively. Computer 56 may be any digital computer suitable for machine control. Tools 50 and 52 are attached to Z direction positioner 62, which is coupled by cable 64 to computer 56. Z direction positioner 62 may be attached or secured by attachment link 66 to positioning system 68, which may be an XY table (X table 70, Y table 72). Positioning system 68 is coupled by cable 74 to computer 56. Positioning system 68 may be attached to a main body 76. A vision system 78 may be used to optically sense the presence of chip and lead frame 48 on material handling system 46. Vision system 78 may include camera and optics which are coupled by cable 80 to computer 56. Thus, ball bonder 44 has one bonding head 82 that may include tool 50, tool 52, vision system 78, and positioning system 68.

In operation of ball bonder 44, the material handling system 46 positions semiconductor chips and lead frames 48 within the field of view 84 of vision system 78. Computer 56 then, electronically sensing the exact position of semiconductor chip and lead frame 48, uses positioning system 68 to precisely position first tool 50 to apply a bond in the first direction. The Z direction positioner 62 then lowers the first tool 50 to make the bond in response to signals on cable 64 from computer 56. Tool 50 may be appropriately incremented by positioning system 68 to carry out another bond in the same first direction. Once the desired number of bonds in the first direction are completed, the Z direction positioner 62 may be instructed by computer 56 over cable 64 to move first tool 50 to an idle position and second tool 52 is brought into an active position by Z axis positioner 62. The same process is repeated with tool 52 to place bonds in a second direction. Once the particular semiconductor chip and lead frame 48 being worked on is complete, the material handling system 46 will increment to the next chip and lead frame 48.

Ball bonder 44 requires only one vision system 78 and one positioning system 68 and one computer 56. Furthermore, through use of a multiplexer, a minimum number of signals must be generated by computer 56 to control both tools 50 and 52.

Figure 5:
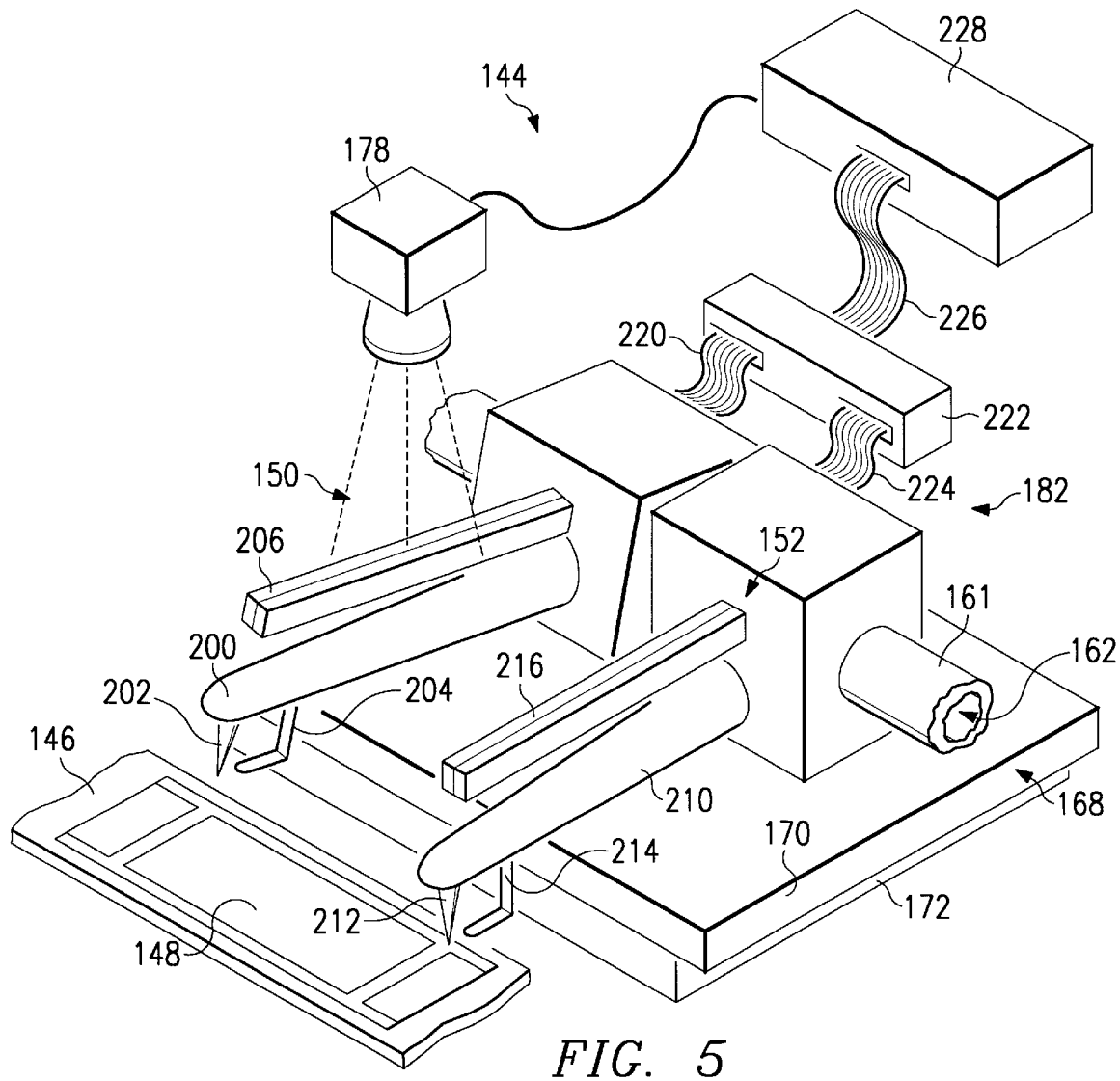
FIG. 5 is a perspective view of one embodiment of the present invention.

Referring now to FIG. 5, ball bonder 144 is shown having a single head 182 with a first bonding tool 150 and a second bonding tool 152. Bonding tool 150 includes a compression arm 200 having a capillary tube 202 oriented in a first direction and an EFO 204 and a clamp 206. Fine wire is threaded through clamp 206 and into capillary 202 of compression arm 200. Similarly, second tool 152 includes a compression arm 210, a capillary tube 212, EFO 214, and a clamp 216.

First tool 150 is coupled by a plurality of cables 220 to multiplexer 222. Similarly, second tool 152 is coupled by a plurality of cables 224 to multiplexer 222. Multiplexer 222 is coupled by a plurality of cables 226 to computer 228. Computer 228 includes an ultrasonic drive, positioning feedback processing, wire clamp drive, touchdown detector and error sensing as well as instructions for operating ball bonder 144.

Ball bonder 144 includes a vision system 178 which includes camera and optics to electronically sense the location of semiconductor chips and lead frames 148. Chips and lead frame 148 are positioned within the appropriate work area for ball bonder 144 by a material handling system 146. Additionally positioning of tools 150 and 152 is accomplished by positioning system 168 which may be, for example, an X table 170 and a Y table 172.

Ball bonder 144 includes a Z direction positioner 162 which is shown in this embodiment as a rod 161 which may be rotated accordingly to bring either tool 150 or tool 152 into contact with chip and lead frame 148, or rod 161 may be fixed and tools 150 and 152 may have their own motors or other means of moving the tools relative to rod 161 as described in more detail below. Tools 150 and 152 each have an idle position and an active position. In the idle position, the tool may be arranged to disconnect from rod 161 and remain in a safe position, and at the same time the other tool remains engaged with rod 161. In this embodiment, tools 150 and 152 operate sequentially on the chip and lead frame 148. In the embodiment, the default position for tools 150 and 152 is the idle position. The aspect of Z direction positioner 162 which engages tool 150 and 152 to the active state may be accomplished using a solenoid activated clutch.

Figure 6:
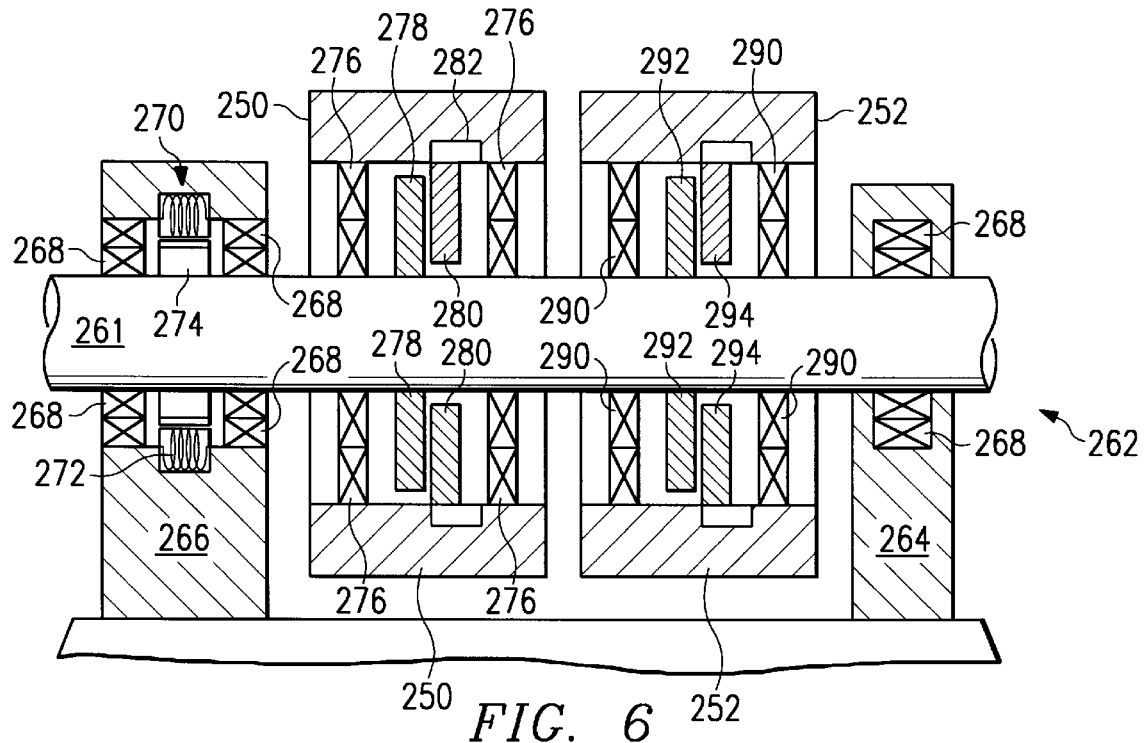
FIG. 6 is a cross-sectional schematic of a Z driver according to one aspect of the present invention.

Referring now to FIG. 6, Z direction positioner, or Z driver, 262 has a shaft of rod 261. Shaft 261 has a first support 264 and a second support 266. Supports 264 and 266 utilize bearings 268 to rotatably support shaft 261. Support 266 includes motor 270, which includes motor coils 272 and motor magnets 274. Motor 270 is coupled to a computer, such as computer 228, to receive appropriate instructions for the bonding cycle.

The first tool 250 has shaft 261 extending through a portion of tool 250. Tool 250 has bearings 276 disposed between tool 250 and shaft 261 to allow rotatable support. Mounted on shaft 261 is first clutch element 278. Tool 250 has a second clutch element 280. When it is desirable to move tool 250 in coordination with shaft 261, second clutch element 280 may be brought into contact with first clutch element 278 by any means known in the art such as solenoids 282. When first clutch element 278 and second clutch element 280 are not in contact, tool 250 is moved to a safe position by a biasing means or counter balance. Similarly, tool 252 is rotatably supported on shaft 261 by bearings 290. A third clutch element 292 is mounted on shaft 261 and a fourth clutch element 294 is attached to second tool 252. When third clutch element 292 and fourth clutch element 294 are not engaged, tool 252 is moved to a safe position, or idle position, by a biasing means or spring.

When it is desirable to move tool 252 in coordination with shaft 261, fourth clutch element 294 may be brought into contact with third clutch element 292 by any means known in the art such as solenoids 294.

Figure 7:
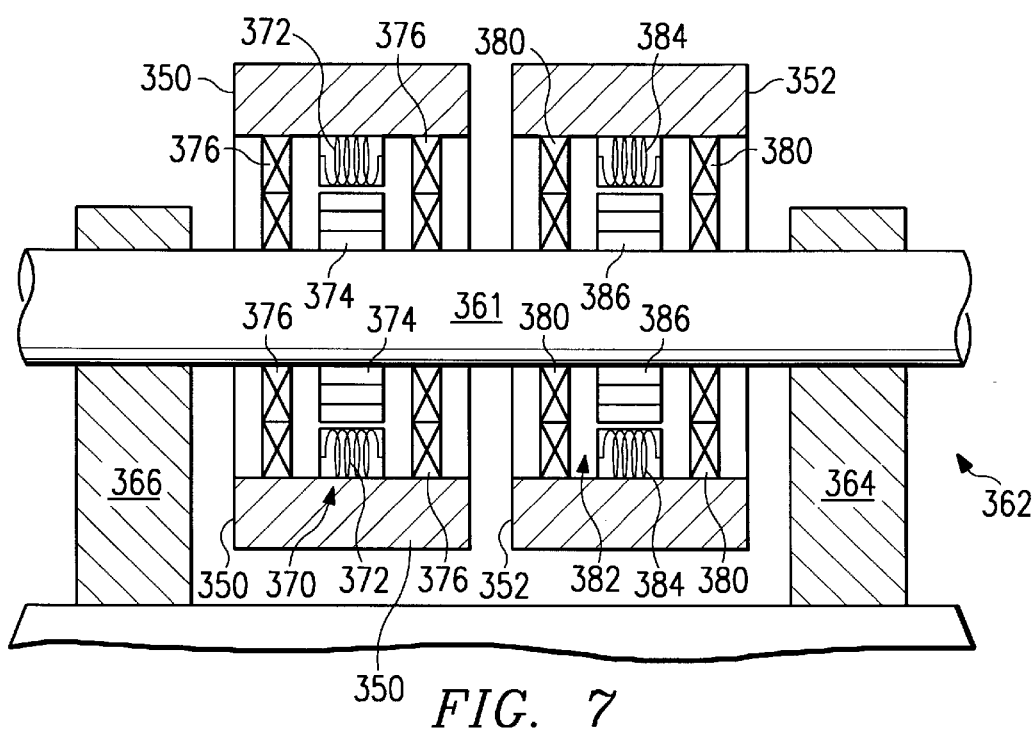
FIG. 7 is a cross-sectional schematic of another embodiment of a Z driver according to an aspect of the present invention.

Referring now to FIG. 7, another Z axis positioner or driver 362 that may be used with ball bonder 144 is shown. The driver 362 includes a shaft 361 that is rigidly supported by a first support 364 and a second support 366. First tool 350 is shown rotatably supported on shaft 361 by bearings 376. To provide for relative movement between shaft 361 and tool 350, a motor 370 is provided that acts between shaft 361 and tool 350. Motor 370 is shown with coils 372 and motor magnets 374. Similarly, second tool 352 is rotatably supported by bearings 380 and is selectively rotatable with respect to shaft 361 under the influence of motor 382, which includes coils 384 and magnets 386. With positioner 362, a control signal may be selectively sent to either motor 370 or motor 382 by a computer, such as computer 228, to move tools 350 and 352 through a bonding cycle.

Other Z driver designs could include a solenoid activated pin or magnetic coupling to lock the tool onto the Z drive 162. Additionally, in another embodiment, tools 150 and 152 could be mounted on a swivel and be rotated into the active position, e.g., could be mounted on a common axis 180° apart.

By using ball bonder 144 with a single vision system 178, a single computer system 228, single positioning system 168, and single Z-driver 162, a system is created that can accommodate at least two differently oriented capillaries 202 and 212, and thereby complete bonds in two directions with a single-headed bonder 144. This reduces the size, cost, complexity and tool-to-tool variation.

Although the present invention and its advantages have been described in detail, it should be understood that various changes, substitutions and alterations can be made herein without departing from the spirit and scope of the invention as defined by the following claims.

What is claimed is:

1. A method of manufacturing an apparatus for automatically forming ball bonds to interconnect fine wires between bond pads on a semiconductor chip and a lead frame, the method comprising the steps of:

providing a computer for controlling the interconnecting;

coupling a vision system to the computer for electronically sensing the location of the semiconductor chip;

forming a tool head having a first tool for applying bonds in a first direction and a second tool for applying bonds in a second direction;

attaching the tool head to a positioning system.

2. The method of claim 1 further comprising the step of coupling a Z driver to the first and second tools for selectively bringing the first bonding tool into contact with a semiconductor chip and selectively bringing the second bonding tool into contact with a semiconductor chip.

3. The method of claim 1 wherein the step of attaching the tool head to the positioning system comprises the step of attaching an X-Y table to the tool head.

4. The method of claim 1 wherein the step of forming a tool head further comprises the step of forming a third bonding tool coupled to the computer for forming ball bonds on the semiconductor chip in a third direction.

5. The method of claim 1 further comprising the step of attaching a multiplexer between the first tool and the computer and between the second tool and the computer.

6. A single head, multiple-tool wire bonder system for automatically forming ball bonds to interconnect bonding pads on a semiconductor chip with lead fingers on a carrier, the apparatus comprising:

a main body;

a material handling system for holding the semiconductor chip and lead frame;

a computer for controlling the system; and a wire bonder head coupled to the main body, the bonder head comprising:

an x-y platform coupled to the computer and operable to move the wire bonder in a first and a second direction relative to the semiconductor chip on the material handling system and responsive to the computer, a vision system coupled to the main body and the computer for electronically sensing the location of the semiconductor chip on the material handling system, a first bonding tool moveably coupled to the main body and having an idle position and an action position, the first bonding tool for forming bonds on the semiconductor chip in a first direction, and a second bonding tool moveably coupled to the main body and having an idle position and an action position, the second bonding tool for forming bonds on the semiconductor chip in a second direction.

7. The system of claim 6 wherein the wire bonder head further comprises a third bonding tool coupled to the computer for forming ball bonds on the semiconductor chip in a third direction.

8. The system of claim 6 wherein the wire bonder head further comprises a Z driver for selectively bringing the first tool and second tool into contact with the semiconductor chip.

9. The system of claim 6 wherein the wire bonder head further comprises a Z driver for selectively bringing the first tool and second tool into contact with the semiconductor chip, and wherein the Z driver comprises:

a rotatably supported shaft, the first tool rotatably supported by the shaft and the second tool rotatably supported by the shaft;

a motor coupled to the shaft for rotating the shaft in response to the computer;

a first clutch attached to the first tool for selectively engaging the shaft to cause the first tool to rotate with the shaft; and a second clutch attached to the second tool for selectively engaging the shaft to cause the second tool to rotate with the shaft.

10. The system of claim 6 wherein the wire bonder head further comprises a Z driver for selectively bringing the first tool and second tool into contact with the semiconductor chip, and wherein the Z driver comprises:

a shaft having the first tool rotatably mounted to the shaft and the second tool rotatably mounted to the shaft;

a first motor coupled to the computer and attached to the first tool and the shaft for selectively causing rotation of the first tool relative to the shaft in response to the computer;

a second motor coupled to the computer and attached to the second tool and the shaft for selectively causing rotation of the second tool relative to the shaft responsive to the computer.

11. The system of claim 6 further comprising a multiplexer and wherein the first tool and second tool are coupled to the computer by the multiplexer.

12. A multiple-tool wire bonder for automatically forming ball bonds to interconnect fine wires between bond pads on a semiconductor chip and a lead frame, the apparatus comprising:
- a computer to control the interconnecting;
- a vision system coupled to the computer for electronically sensing the location of the semiconductor chip;
- a positioning system; and
- a tool head attached to the positioning system, the tool head comprising:
  - a first bonding tool coupled to the computer for forming ball bonds on the chip in a first direction, and
  - a second bonding tool coupled to the computer for forming ball bonds on the chip in a second direction, the second bonding tool adjacent to the first bonding tool.

13. The wire bonder of claim 12 further comprising a Z driver for selectively bringing the first bonding tool into contact with a semiconductor chip and selectively bringing the second bonding tool into contact with a semiconductor chip.

14. The wire bonder of claim 12 wherein the positioner comprises an X-Y table.

15. The wire bonder of claim 12 wherein the tool head further comprises a third bonding tool coupled to the computer for forming ball bonds on the semiconductor chip in a third direction.

16. The wire bonder of claim 12 further comprising a Z driver for selectively bringing the first bonding tool into contact with a semiconductor chip and selectively bringing the second bonding tool into contact with a semiconductor chip, and wherein the Z driver comprises:
- a rotatably supported shaft, the first tool rotatably supported by the shaft and the second tool rotatably supported by the shaft;
- a motor coupled to the shaft for rotating the shaft in response to signals from the computer;
- a first clutch attached to the first tool for selectively engaging the shaft to cause the first tool to rotate with the shaft; and
- a second clutch attached to the second tool for selectively engaging the shaft to cause the second tool to rotate with the shaft.

17. The wire bonder of claim 12 further comprising a Z driver for selectively bringing the first bonding tool into contact with a semiconductor chip and selectively bringing the second bonding tool into contact with a semiconductor chip, and wherein the Z driver comprises:
- a shaft having the first tool rotatably mounted to the shaft and the second tool rotatably mounted to the shaft;
- a first motor coupled to the computer and attached to the first tool and the shaft for selectively causing rotation of the first tool relative to the shaft in response to signals from the computer;
- a second motor coupled to the computer and attached to the second tool and the shaft for selectively causing rotation of the second tool relative to the shaft in response to signals from the computer.

18. The wire bonder of claim 12 further comprising a multiplexer and wherein the first tool and second tool are coupled to the computer by the multiplexer.

* * * * *